United States Patent
Hirota et al.

(10) Patent No.: US 9,859,329 B2
(45) Date of Patent: Jan. 2, 2018

(54) IMAGING DEVICE MANUFACTURING METHOD

(71) Applicant: CANON KABUSHIKI KAISHA, Tokyo (JP)

(72) Inventors: Katsunori Hirota, Yamato (JP); Satoshi Ogawa, Oume (JP); Nobutaka Ukigaya, Yokohama (JP)

(73) Assignee: Canon Kabushiki Kaisha, Tokyo (JP)

( * ) Notice: Subject to any disclaimer, the term of this patent is extended or adjusted under 35 U.S.C. 154(b) by 0 days.

(21) Appl. No.: 15/383,357

(22) Filed: Dec. 19, 2016

(65) Prior Publication Data

US 2017/0179191 A1 Jun. 22, 2017

(30) Foreign Application Priority Data

Dec. 21, 2015 (JP) .................................. 2015-249094

(51) Int. Cl.
*H01L 21/00* (2006.01)
*H01L 27/146* (2006.01)

(52) U.S. Cl.
CPC .. *H01L 27/14689* (2013.01); *H01L 27/14614* (2013.01); *H01L 27/14643* (2013.01); *H01L 27/14692* (2013.01)

(58) Field of Classification Search
CPC ......... H01L 27/14614; H01L 27/14643; H01L 27/14689; H01L 27/14692
USPC .... 438/97, 692, 694, 716, 748; 257/E21.219
See application file for complete search history.

(56) References Cited

U.S. PATENT DOCUMENTS

| | | | | |
|---|---|---|---|---|
| 5,233,218 A | * | 8/1993 | Miura | H01L 21/76251 257/347 |
| 5,426,073 A | * | 6/1995 | Imaoka | B24B 9/065 257/E21.215 |
| 5,882,401 A | * | 3/1999 | Maruyama | C30B 29/06 117/106 |
| 6,150,696 A | * | 11/2000 | Iwamatsu | H01L 27/1203 257/347 |
| 6,232,201 B1 | * | 5/2001 | Yoshida | H01L 21/3105 257/E21.241 |
| 6,291,315 B1 | * | 9/2001 | Nakayama | H01L 21/76251 257/E21.232 |
| 6,315,826 B1 | * | 11/2001 | Muramatsu | H01L 21/302 117/2 |
| 6,653,205 B2 | * | 11/2003 | Yanagita | H01L 21/67092 156/763 |

(Continued)

FOREIGN PATENT DOCUMENTS

| | | |
|---|---|---|
| JP | 2011-040545 A | 2/2011 |
| JP | 2011-187585 A | 9/2011 |

(Continued)

*Primary Examiner* — Brook Kebede

(74) *Attorney, Agent, or Firm* — Canon U.S.A. Inc., IP Division

(57) ABSTRACT

There is provided an imaging device manufacturing method contributing to improved reliability and yield. The method includes forming a first insulating film on a polysilicon film and then removing a portion of the first insulating film formed on a second main surface and a portion of the first insulating film formed on a side surface of the substrate to expose a polysilicon film. After the polysilicon film is exposed, a second insulating film is formed on the first main surface by a plasma chemical vapor deposition (CVD) method.

8 Claims, 9 Drawing Sheets

(56) References Cited

U.S. PATENT DOCUMENTS

| | | | | |
|---|---|---|---|---|
| 6,653,206 | B2* | 11/2003 | Yanagita | H01L 21/67092 |
| | | | | 438/455 |
| 6,861,359 | B2* | 3/2005 | Ota | H01L 21/02087 |
| | | | | 257/E21.251 |
| 6,924,236 | B2* | 8/2005 | Yano | H01L 21/02087 |
| | | | | 257/E21.23 |
| 7,195,988 | B2* | 3/2007 | Nemoto | H01L 21/6835 |
| | | | | 257/E21.238 |
| 7,410,885 | B2* | 8/2008 | Schuehrer | H01L 21/02087 |
| | | | | 257/E21.088 |
| 7,709,393 | B2* | 5/2010 | Kim | H01L 21/02087 |
| | | | | 438/706 |
| 7,759,252 | B2* | 7/2010 | Wang | H01L 21/3081 |
| | | | | 216/91 |
| 8,426,312 | B2* | 4/2013 | Richter | H01L 21/02087 |
| | | | | 438/689 |
| 2009/0017626 | A1* | 1/2009 | Park | C09K 13/08 |
| | | | | 438/694 |
| 2009/0085174 | A1* | 4/2009 | Noda | C23C 16/24 |
| | | | | 257/636 |
| 2010/0200854 | A1* | 8/2010 | Alami-Idrissi | H01L 21/02032 |
| | | | | 257/49 |
| 2010/0227461 | A1 | 9/2010 | Ochi | |

FOREIGN PATENT DOCUMENTS

| | | |
|---|---|---|
| JP | 2012-129312 A | 7/2012 |
| JP | 2012-182426 A | 9/2012 |

\* cited by examiner

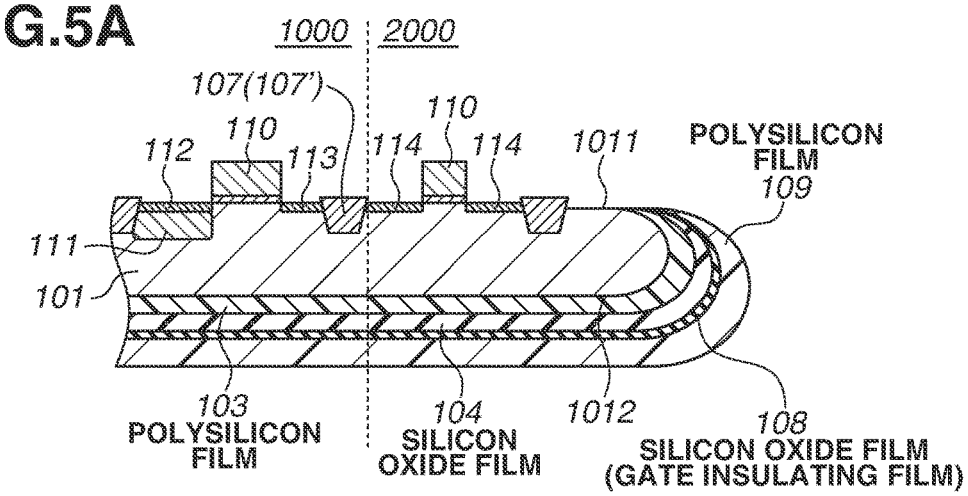
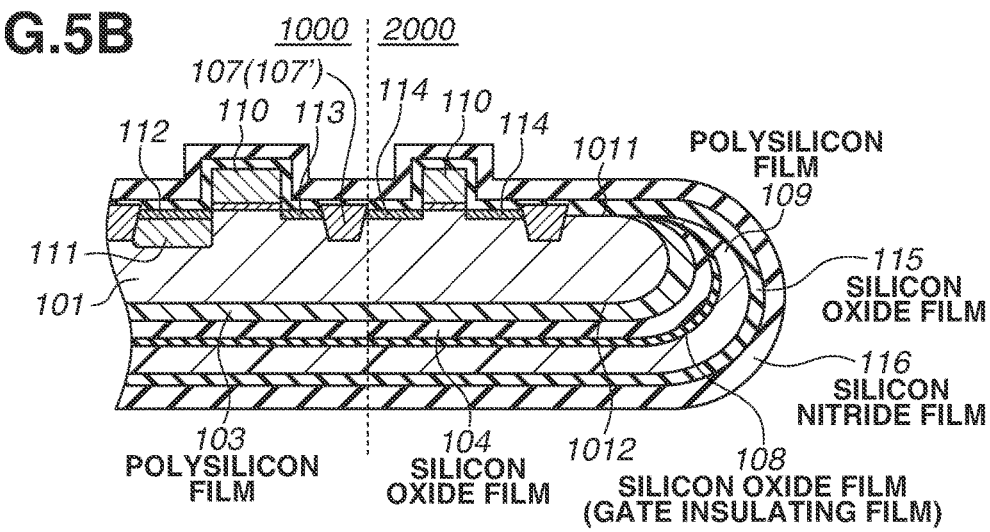
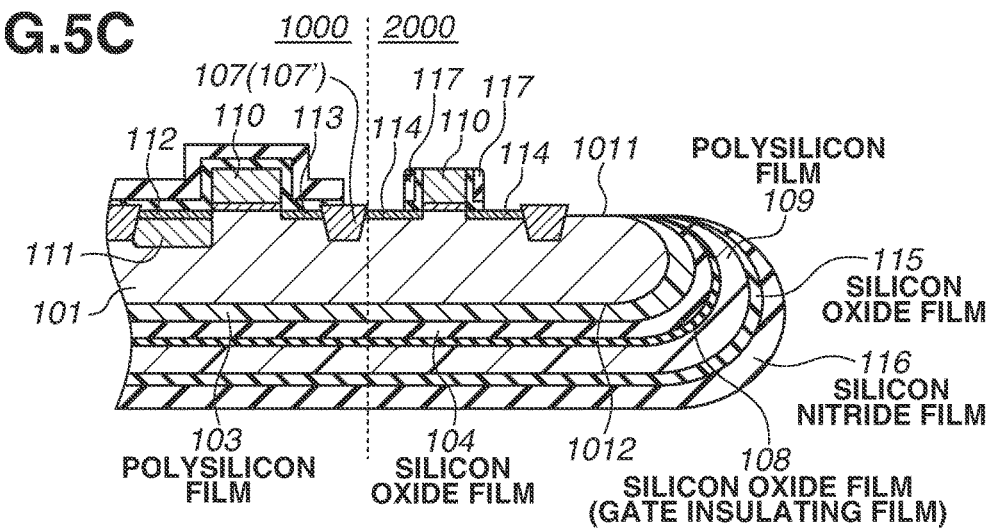

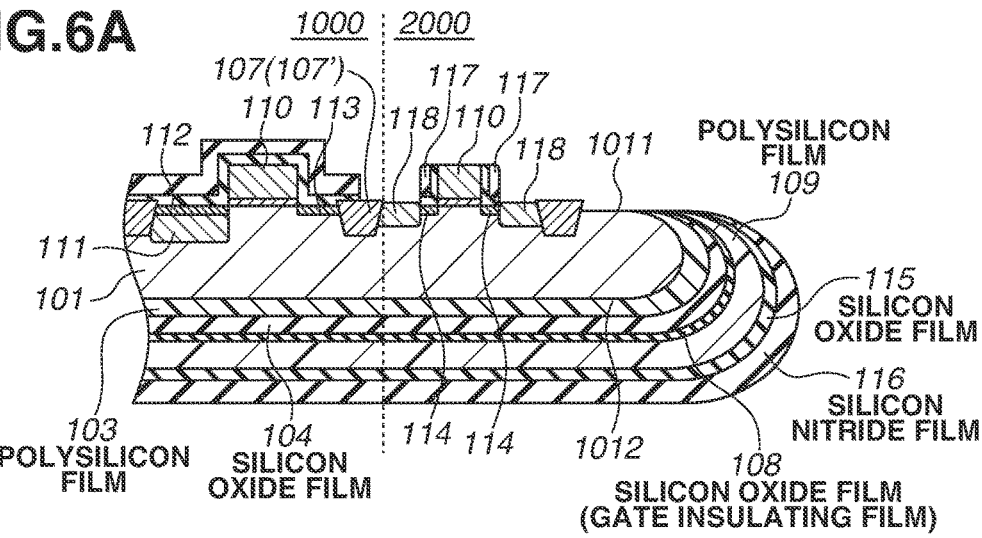
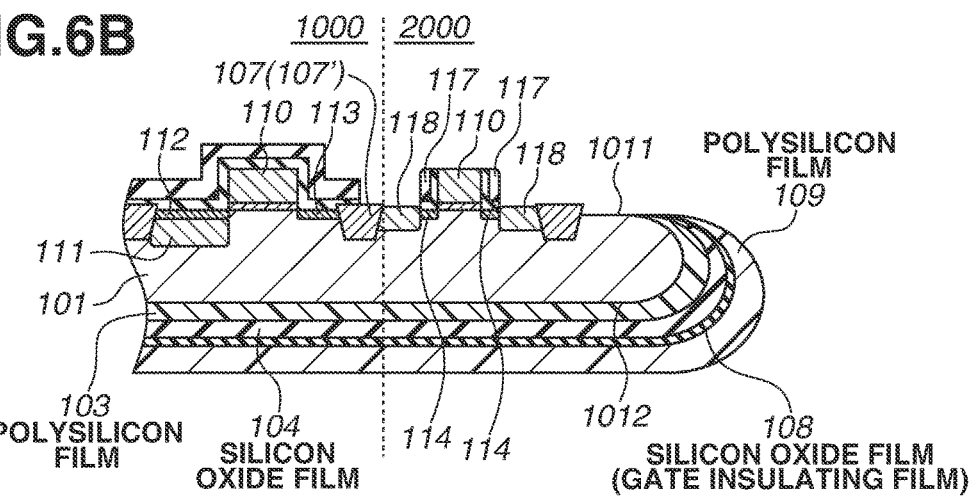
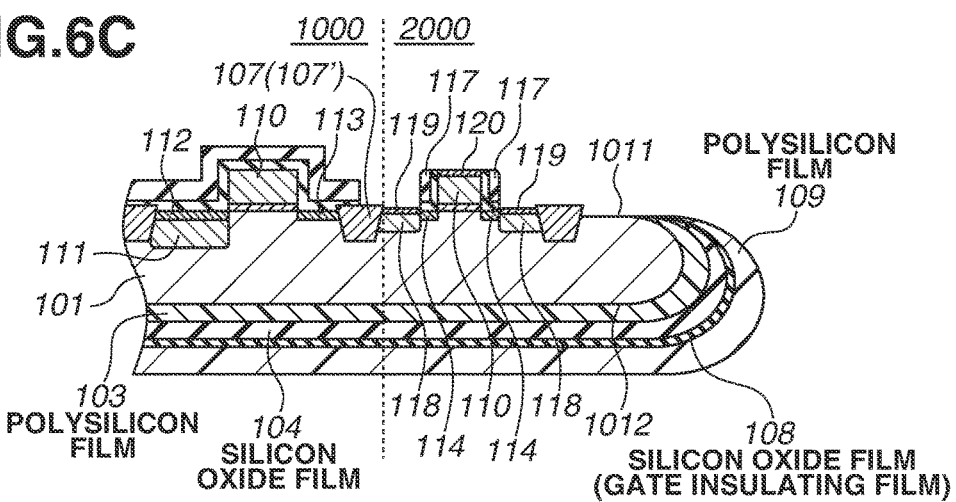

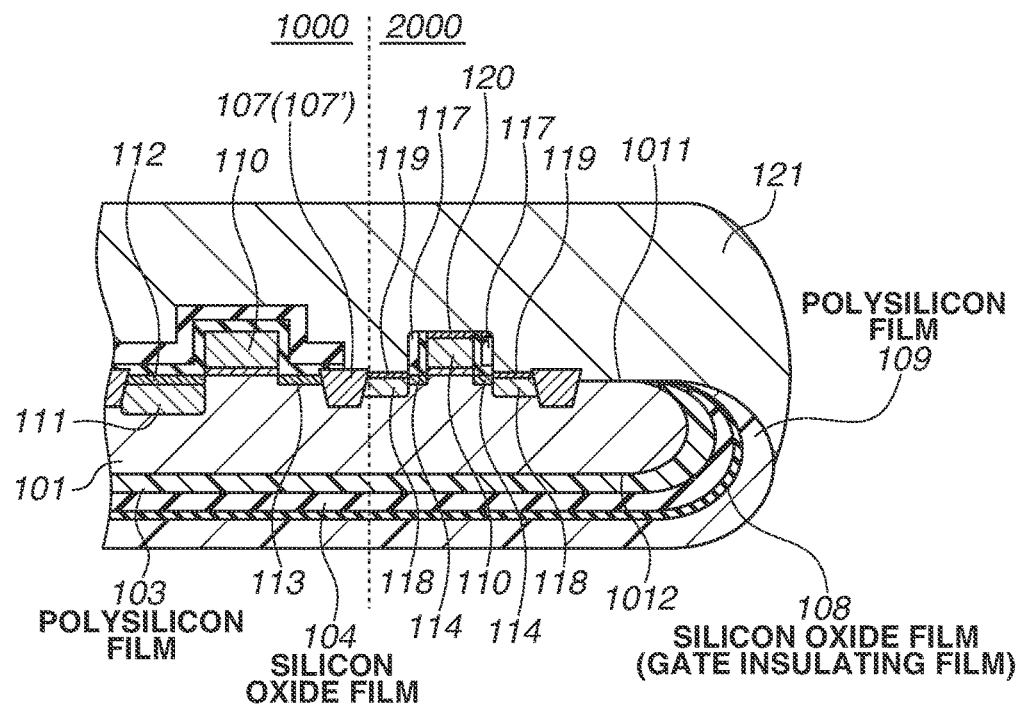
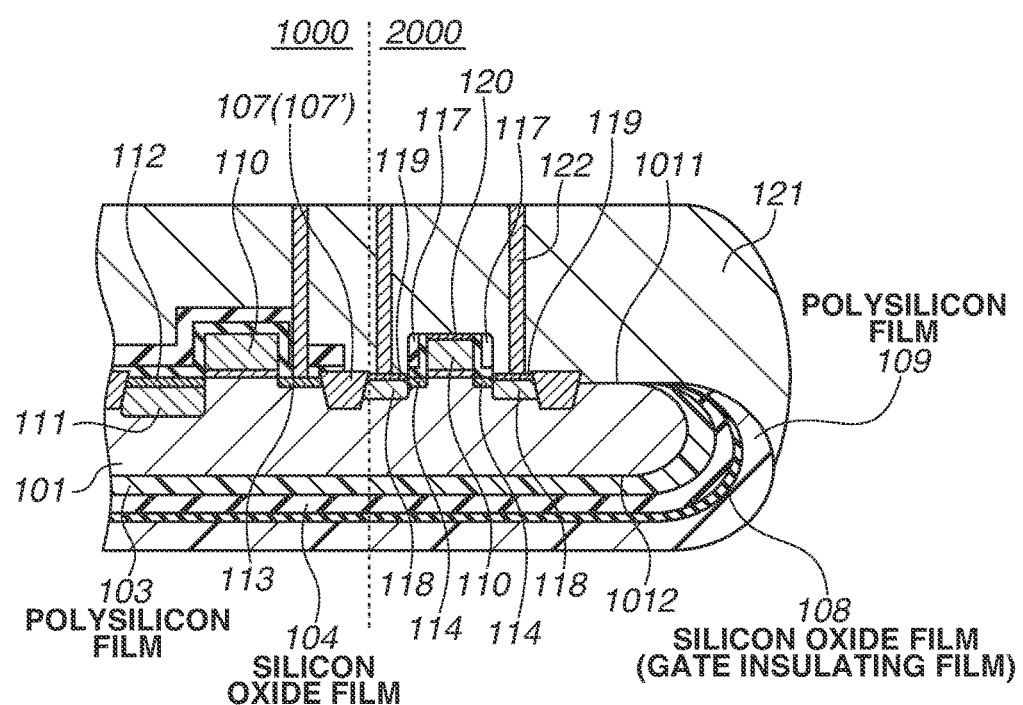

IMAGING DEVICE MANUFACTURING METHOD

BACKGROUND OF THE INVENTION

Field of the Invention

The present disclosure relates to an imaging device manufacturing method.

Description of the Related Art

Metal impurities such as iron and nickel may be mixed into a substrate for an imaging device such as a complementary metal-oxide semiconductor (CMOS) sensor in a process of manufacturing the imaging device. The metal impurities, particularly heavy metal impurities, electrically activated in the silicon substrate may cause white flaws as one of the characteristics of the imaging device due to the fixed charge.

Japanese Patent Application Laid-Open No. 2012-129312 discusses a process of directly forming a polysilicon film on a lower surface of a substrate. The polysilicon film formed on the back surface of the silicon substrate functions as a film for capturing (gettering) the metal impurities mixed in the process of manufacturing the imaging device in a region away from an active region.

In addition, Japanese Patent Application Laid-Open No. 2012-129312 also discusses forming a protective film on the polysilicon film formed on the back surface of the substrate to prevent the polysilicon film formed on the back surface of the substrate from being removed in a process of removing the polysilicon film formed on the front surface of the substrate. For example, the protective film for protecting the polysilicon film is an insulating film made of a silicon oxide film formed, for example, by a thermal oxidation method or a low-pressure (LP) thermal chemical vapor deposition (CVD) method (LPCVD method).

On the other hand, Japanese Patent Application Laid-Open No. 2012-182426 discusses forming an insulating film functioning as an antireflection film for light incident on a photoelectric conversion unit in a pixel region and simultaneously forming an insulating film on a side wall of a gate electrode of a transistor disposed in a peripheral circuit region. In this case, the insulating film is formed not only on the front surface side of the substrate but also on the back surface side of the substrate.

SUMMARY OF THE INVENTION

The present inventors have found that an interlayer insulating film or the like formed on the front surface side of a substrate by a plasma CVD method causes dielectric breakdown to occur in a transistor gate insulating film for an imaging device having a polysilicon film and an insulating film for gettering disposed on the back surface side of the substrate. This may, as a result thereof, reduce reliability and manufacturing yield. The present disclosure is directed to an imaging device manufacturing method capable of contributing to improved reliability and manufacturing yield.

According to an aspect of the present disclosure, an imaging device manufacturing method, includes preparing a substrate including a first main surface on which a plurality of transistors is to be formed and a second main surface at an opposite side of the first main surface, forming a polysilicon film on the first main surface, on the second main surface, and on a side surface of the substrate, forming a first insulating film on the polysilicon film formed on the first main surface, on the second main surface, and on the side surface of the substrate, exposing the polysilicon film formed on the second main surface and on the side surface of the substrate by removing a portion of the first insulating film formed on the second main surface and a portion of the first insulating film formed on the side surface of the substrate, and forming a second insulating film on the first main surface by a plasma CVD method after the exposing of the polysilicon film.

Further features will become apparent from the following description of exemplary embodiments with reference to the attached drawings.

BRIEF DESCRIPTION OF THE DRAWINGS

FIGS. 5A, 5B, and 5C are process cross-sectional views illustrating the imaging device manufacturing method according to the first exemplary embodiment.

FIGS. 6A, 6B, and 6C are process cross-sectional views illustrating the imaging device manufacturing method according to the first exemplary embodiment.

FIGS. 7A and 7B are process cross-sectional views illustrating the imaging device manufacturing method according to the first exemplary embodiment.

DESCRIPTION OF THE EMBODIMENTS

Exemplary embodiments of an imaging device manufacturing method will be described in detail below with reference to the attached drawings.

An imaging device manufacturing method according to a first exemplary embodiment will be described with reference to FIGS. 1A to 7B.

Figure 1A:
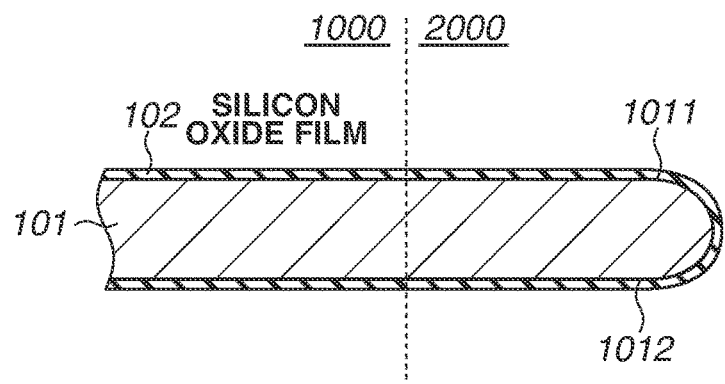
FIGS. 1A, 1B, and 1C are process cross-sectional views illustrating an imaging device manufacturing method according to a first exemplary embodiment.
Figure 1B:
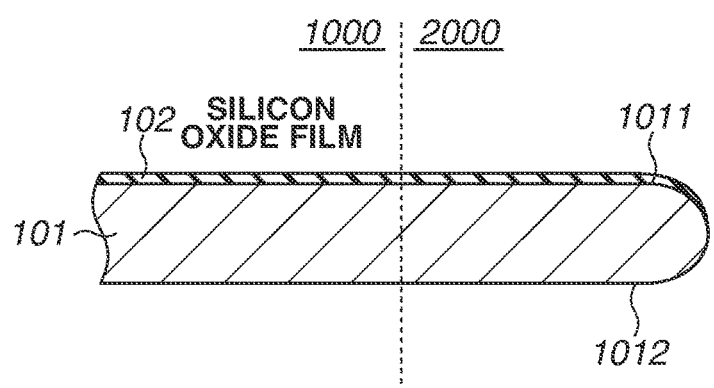
Figure 1C:
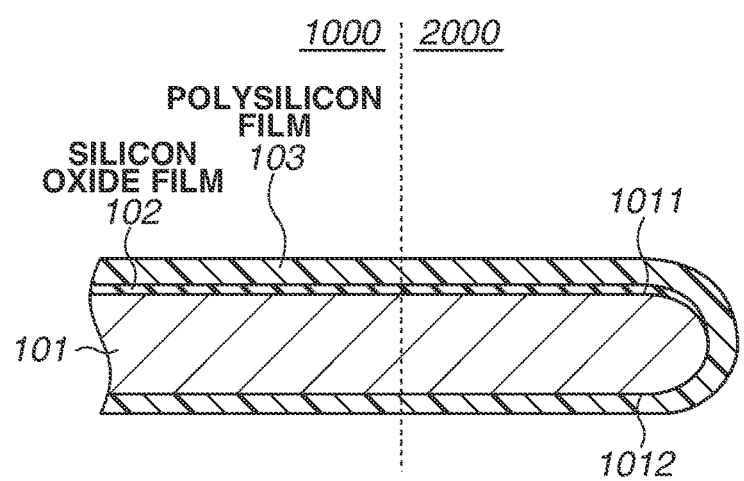

FIGS. 1A, 1B, and 1C are views schematically illustrating a pixel region 1000 including a photoelectric conversion unit and a plurality of transistors such as transfer transistors, amplifying transistors, and selection transistors. Also schematically illustrated is a peripheral circuit region 2000 disposed outside the pixel region and including a plurality of transistors for processing signals output from the pixel region.

First, in a process illustrated in FIG. 1A, a silicon substrate 101 including a first main surface 1011 (front surface 1011) and a second main surface 1012 (back surface 1012) is prepared. As used herein, the front surface 1011 is a surface on which a plurality of transistors is disposed, and the back surface 1012 is an opposite side of the front surface 1011. Next, a silicon oxide film 102 is formed on the substrate 101. The silicon oxide film 102 is formed so as to cover the front surface 1011, the back surface 1012, and a side surface of the substrate 101. More specifically, the silicon oxide film 102 is formed, for example, by heating the substrate 101 at 800° C. to 1000° C. in an oxidation atmosphere in an oxidation furnace. The silicon oxide film 102 is assumed to have a thickness of, for example, 10 nm to 50 nm. It should be noted that the term "upper" as used herein may refer to a direction of laminating a film. In addition, the expression that a film "covers" each surface of the substrate 101 may refer to not only a case in which the film directly contacts the substrate 101, but also a case in which an insulating film is interposed between the substrate 101 and a certain film. Further, the term "side surface" may refer to a surface different from the front surface 1011 and the back surface 1012.

In a process illustrated in FIG. 1B, the silicon oxide film 102 is removed from the back surface side of the substrate 101, to expose the side surface and the back surface 1012 of the substrate 101. This process of removing the silicon oxide film 102 uses, for example, a single wafer cleaning apparatus to treat the silicon oxide film 102 with a dilute hydrogen fluoride (HF) aqueous solution having a concentration of about 100:1 at room temperature. More specifically, in order to remove only the film formed on the back surface side, for example, the cleaning apparatus may be configured to discharge the solution from the nozzle only to the back surface side of the substrate 101. Further, in order not to remove the film formed on the front surface side, for example, the cleaning apparatus may be configured to use an $N_2$ gas or pure water to prevent the front surface side from being exposed to the solution.

Then, in a process illustrated in FIG. 1C, a polysilicon film 103 is formed so as to cover the front surface 1011, the back surface 1012, and the side surface of the substrate 101. The polysilicon film 103 is formed, for example, using a low-pressure thermal CVD apparatus in $SiH_4$ gas atmosphere at a temperature ranging from 530° C. to 650° C. at a pressure in the range of 10 Pa to 150 Pa. The polysilicon film 103 is assumed to have a thickness, for example, in the range of 20 nm to 100 nm. The polysilicon film 103 is used in a subsequent process to suppress the bird's beak or the like which could occur during oxidation of the inner wall of a trench for element isolation.

Figure 2A:
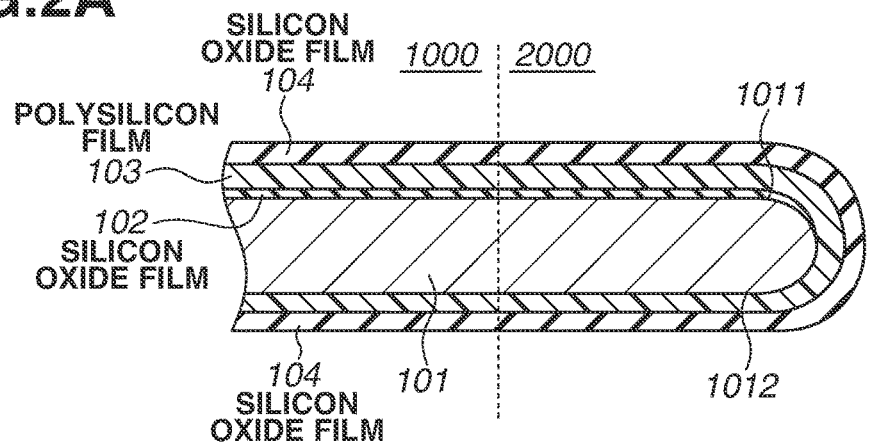
FIGS. 2A, 2B, and 2C are process cross-sectional views illustrating the imaging device manufacturing method according to the first exemplary embodiment.
Figure 2B:
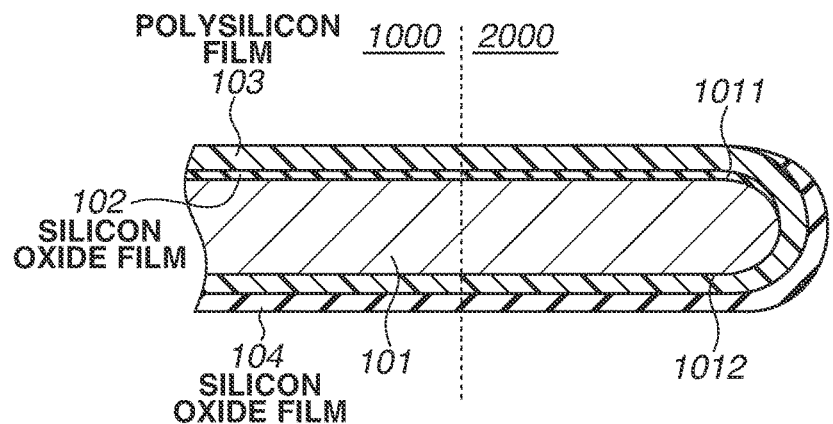

In a process illustrated in FIG. 2A, a silicon oxide film 104 is formed so as to cover the front surface 1011, the back surface 1012, and the side surface of the substrate 101. More specifically, the silicon oxide film 104 is formed, for example, at a temperature ranging from 800° C. to 1000° C. in an oxidation atmosphere using an oxidation furnace. The silicon oxide film 104 has a thickness, for example, in the range of 50 nm to 150 nm. The silicon oxide film 104 may be formed using a low-pressure thermal CVD apparatus. The silicon oxide film 104 functions as a protective film for protecting the polysilicon film 103. Then, in a process illustrated in FIG. 2B, the silicon oxide film 104 is removed from the front surface 1011 of the substrate 101. As a result, the polysilicon film 103 on the front surface 1011 is exposed and the silicon oxide film 104 remains as is on the back surface 1012 and the side surface of the substrate 101. The silicon oxide film 104 on the front surface 1011 is removed, for example, by a wet-etching method. For example, a single wafer cleaning apparatus is used to remove the silicon oxide film 104 with a diluted HF aqueous solution having a concentration of about 100:1 at room temperature.

Figure 2C:
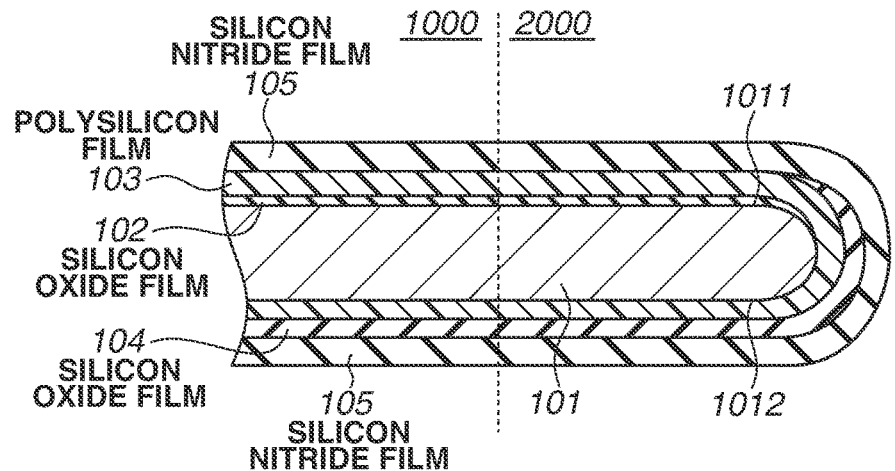

Then, in a process illustrated in FIG. 2C, a silicon nitride film 105 is formed so as to cover the front surface 1011, the back surface 1012, and the side surface of the substrate 101. More specifically, the silicon nitride film 105 is formed, for example, using a low-pressure thermal CVD apparatus in a mixed-gas atmosphere of $SiH_2Cl_2$ and $NH_3$ at a temperature ranging from 650° C. to 850° C. at a pressure ranging from 10 Pa to 150 Pa. The silicon nitride film 105 has a thickness, for example, in the range of 100 nm to 300 nm.

Figure 3A:
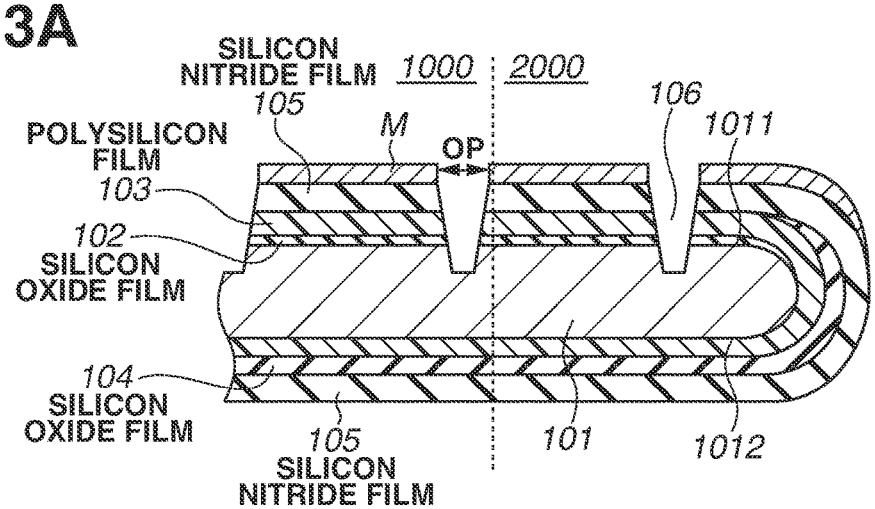
FIGS. 3A, 3B, and 3C are process cross-sectional views illustrating the imaging device manufacturing method according to the first exemplary embodiment.

In a process illustrated in FIG. 3A, a mask M such as a photoresist pattern is formed on the silicon nitride film 105 on the front surface 1011 of the substrate 101. Then, in this process, the silicon nitride film 105, the polysilicon film 103, the silicon oxide film 102, and the substrate 101 on the front surface 1011 are etched through an opening OP of the mask M. As a result, a trench 106 is formed in the front surface 1011 of the substrate 101. This etching method may be, for example, a dry etching method. The trench 106 has a depth, for example, in the range of 100 nm to 300 nm. The process of forming the trench 106 may be followed by an oxidation process of forming a silicon oxide film in an inner wall of the trench 106.

Figure 3B:
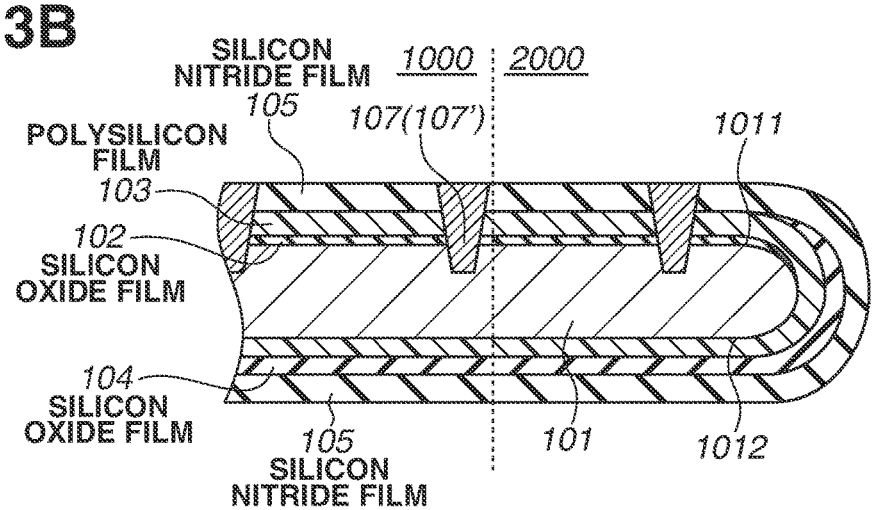

In a process illustrated in FIG. 3B, a silicon oxide film 102 is formed on the front surface side (the front surface of the silicon nitride film 105) of the substrate 101 so as to fill the inside of the trench 106. The silicon oxide film 102 is formed, for example, by a high-density plasma (HDP) CVD apparatus using a mixed gas of Ar, $O_2$, and $SiH_4$ as a process gas at a temperature ranging from 300° C. to 800° C. The silicon oxide film 102 has a thickness, for example, in the range of 300 nm to 700 nm. Then, the silicon oxide film 102 is removed and polished by a chemical mechanical polish (CMP) method. In this process, the front surface of the silicon nitride film 105 is exposed while leaving the silicon oxide film 102 inside the trench 106. As a result, an element isolation region 107' defining an active region is formed. The process of forming the element isolation in this manner is referred to as a shallow trench isolation (STI).

Figure 3C:
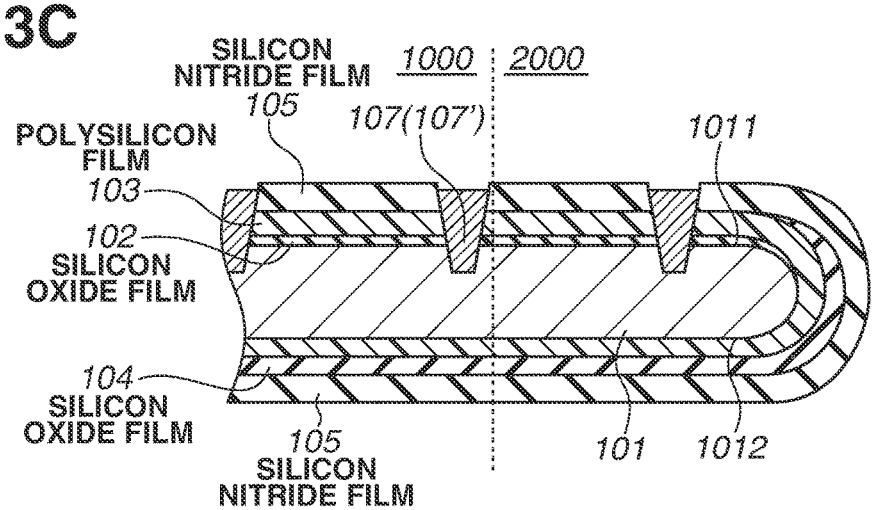

Then, in a process illustrated in FIG. 3C, the thickness of the element isolation region 107' is adjusted. This process can be implemented, for example, by a wet-etching method. This process is implemented, for example, by a batch cleaning apparatus using a diluted HF aqueous solution having a concentration of about 100:1 as a processing liquid at room temperature.

Figure 4A:
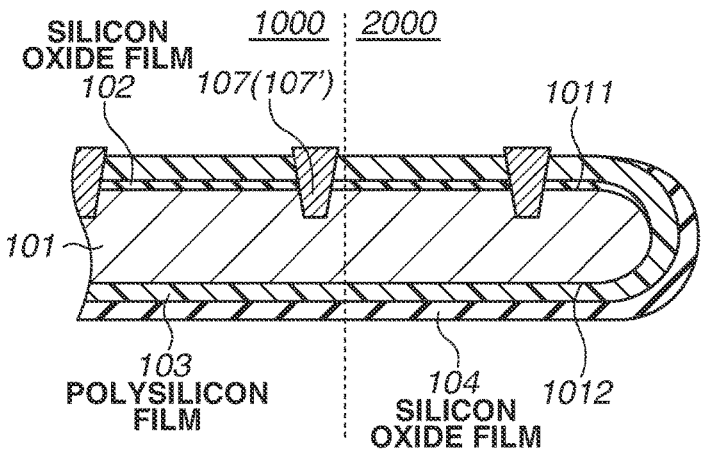
FIGS. 4A, 4B, and 4C are process cross-sectional views illustrating the imaging device manufacturing method according to the first exemplary embodiment.

In a process illustrated in FIG. 4A, the polysilicon film 103 on the front surface 1011, and the silicon oxide film 104 on the side surface and the back surface 1012 are exposed by removing the silicon nitride film 105 on the front surface 1011, the side surface, and the back surface 1012 of the substrate 101. More specifically, the silicon nitride film 105 is removed, for example, using a batch cleaning apparatus by phosphoric acid adjusted to a temperature ranging from 150° C. to 170° C.

Figure 4B:
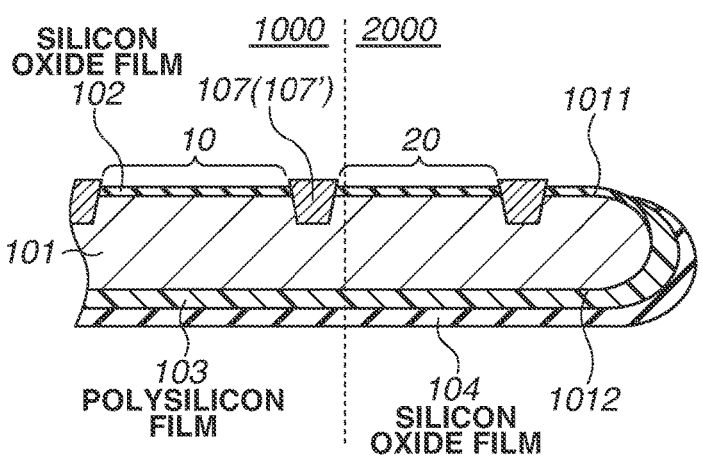

In a process illustrated in FIG. 4B, the polysilicon film 103 on the front surface 1011 of the substrate 101 is removed. At this time, the silicon oxide film 104 on the back surface side functions as a protective film for protecting the polysilicon film 103 on the back surface side. More specifically, the polysilicon film 103 is removed, for example, using a batch cleaning apparatus with a mixed solution of ammonia, hydrogen peroxide, and pure water at a temperature ranging from 50° C. to 100° C. Such conditions ensure a high etching selectivity between the polysilicon film 103 and the silicon oxide film 104.

The above-described processes enable the polysilicon film 103 to remain on the back surface side of the substrate 101. The polysilicon film 103 has a gettering effect, which can suppress a white flaw from occurring in the imaging device due to metal impurity contamination.

Then, although not illustrated, a photoresist film is formed on the front surface 1011 of the substrate 101 as needed and the photoresist film is used as a mask to introduce impurities into the substrate 101 to form a well in the pixel region 1000 and a well in the peripheral circuit region 2000 as needed.

Figure 4C:
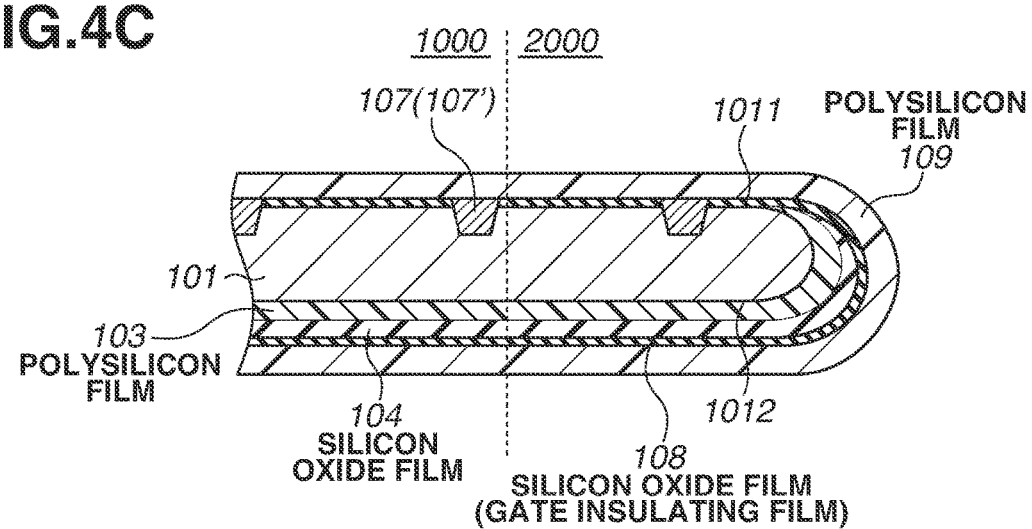

Then, in a process illustrated in FIG. 4C, the front surface 1011 of the substrate 101 is exposed by removing the silicon oxide film 102 on the front surface 1011 of the substrate 101. More specifically, the silicon oxide film 102 is removed, for example, using a single wafer cleaning apparatus with a diluted HF aqueous solution having a concentration of about 100:1 at room temperature. Then, a silicon oxide film 108 is formed so as to cover the front surface 1011, the back surface 1012, and the side surface of the substrate 101. The silicon oxide film 108 functions as a transistor gate insulating film. More specifically, the silicon oxide film 108 is formed, for example, using an oxidation furnace at a temperature ranging from 800° C. to 1000° C. in an oxidation atmosphere. The silicon oxide film 108 has a thickness, for example, in the range of 2 nm to 15 nm. Then, a polysilicon film 109 is formed so as to cover the front surface 1011, the back surface 1012, and the side surface of the substrate 101. This polysilicon film 109 forms transistor gate electrodes in a subsequent process. More specifically, the polysilicon film 109 can be formed, for example, using a low-pressure thermal CVD apparatus in a $SiH_4$ gas atmosphere at a temperature ranging from 530° C. to 650° C. at a pressure ranging from 10 Pa to 150 Pa. The polysilicon film 109 has a thickness, for example, in the range of 100 nm to 300 nm.

In a process illustrated in FIG. 5A, a photoresist film is formed on the front surface 1011 of the substrate 101 as needed to perform patterning of the polysilicon film 109. Then, a gate electrode 110 is formed of the patterned polysilicon film. Then, a photoresist film is formed on the front surface 1011 of the substrate 101 as needed and the photoresist film is used as a mask to introduce impurities into the substrate 101. In this way, in the pixel region 1000, a photoelectric conversion unit 111, a front surface region 112 ensuring the embedded structure of the photoelectric conversion unit 111, and a floating diffusion (FD) 113 are formed as needed. In the peripheral circuit region 2000, a region 114 serving as a lightly doped drain (LLD) structure is formed as needed.

In a process illustrated in FIG. 5B, a silicon oxide film 115 is formed on the front surface 1011, the back surface 1012, and the side surface of the substrate 101. Then, the silicon oxide film 115 contacts the gate electrode 110. The silicon oxide film 115 is formed, for example, using a low-pressure thermal CVD apparatus in a mixed-gas atmosphere of $Si(OC_2H_5)_4$ and $O_2$ at a temperature ranging from 600° C. to 800° C. at a pressure ranging from 10 Pa to 150 Pa. The silicon oxide film 115 has a thickness, for example, in the range of 5 nm to 20 nm. Then, a silicon nitride film 116 is formed on the silicon oxide film 115 formed on the front surface 1011, the back surface 1012, and the side surface of the substrate 101. More specifically, the silicon nitride film 116 is formed, for example, using a low-pressure thermal CVD apparatus in a mixed-gas atmosphere of $SiH_2Cl_2$ and $NH_3$ at a temperature ranging from 650° C. to 850° C. at a pressure ranging from 10 Pa to 150 Pa. The silicon nitride film 116 has a thickness, for example, in the range of 10 nm to 100 nm. This process resultantly forms a laminated film (first insulating film) having the silicon oxide film 115 and the silicon nitride film 116.

Then, in a process illustrated in FIG. 5C, a photoresist film is formed on the front surface 1011 of the substrate 101 as needed and the photoresist film is used as a mask to perform anisotropic etching on a laminated film including the silicon oxide film 115 and the silicon nitride film 116. Then, in the peripheral circuit region 2000, the silicon oxide film 115 and the silicon nitride film 116 are formed on a side wall portion of the gate electrode 110. In the pixel region 1000, a laminated film including the silicon oxide film 115 and the silicon nitride film 116 is formed so as to cover a gate electrode, a source region, and a drain region of a transistor. In the photoelectric conversion unit serving as the source region of a transfer transistor, this laminated film functions as an antireflection film. In this process, the silicon oxide film 115 and the silicon nitride film 116 on the back surface side of the substrate 101 remain unetched.

In a process illustrated in FIG. 6A, a photoresist film is formed on the front surface 1011 of the substrate 101 as needed and the photoresist film is used as a mask to introduce impurities into the substrate 101. Then, in the peripheral circuit region 2000, a source/drain region 118 is formed as needed.

In a process illustrated in FIG. 6B, the silicon nitride film 116 and the silicon oxide film 115 formed so as to cover the back surface side and the side surface of the substrate 101, is removed. This process resultantly exposes a part of the polysilicon film 109 formed on the back surface side and a part of the polysilicon film 109 formed on the side surface. More specifically, the silicon nitride film 116 and the silicon oxide film 115 on the back surface side and on the side surface are removed, for example, by a wet-etching method. The silicon nitride film 116 and the silicon oxide film 115 are removed, for example, using a single wafer cleaning apparatus by HF stock solution at room temperature. With the process illustrated in FIG. 6B, a substrate having the polysilicon film 109 exposed on the back surface side and the side surface is obtained.

The inventors have found that exposing the polysilicon film 109 in this manner reduces the percentage of the gate insulating film suffering from dielectric breakdown even if an interlayer insulating film is formed by a plasma CVD method in a subsequent process. The mechanism of this effect is presumed as follows. When the interlayer insulating film is formed by a plasma CVD method, a large amount of electric charge is accumulated in the gate electrode 110. Even in such a case, the electric charge can be released to the polysilicon film 109 formed on the back surface of the substrate as long as the polysilicon film 109 formed on the back surface of the substrate and the side surface of the substrate is exposed. The substrate is supported by a stage of the plasma CVD apparatus and thus the electric charge accumulated during film formation can be released to the stage side.

As the stage of a plasma CVD apparatus, a system such as a mechanical clamp or a vacuum chuck can be used as needed. In order to enhance the charge-releasing effect, an electro static chuck (ESC) system may be used.

Note that the polysilicon film 109 formed in the peripheral portion of the substrate does not necessarily cover the entire side surface of the substrate as long as the film may be formed to the extent allowing the electric charge to be released to the substrate side during the plasma CVD process. For example, in a plan view from the upper side of the substrate, the polysilicon film 109 may be formed on the side surface of the substrate to the extent the side surface have a region where the polysilicon film 109 does not overlap with the substrate 101.

Further, in the process illustrated in FIG. 6B, the polysilicon film 103 formed on the back surface 1012 of the substrate 101 remains unetched. Therefore, this film functions as a gettering film for removing metal impurities mixed therein in a process of manufacturing the imaging device. As a result, this film can suppress a white flaw from occurring in the imaging device.

Then, in a process illustrated in FIG. 6C, a high-melting-point metal film (not illustrated) is formed on the entire front surface 1011 of the substrate 101, for example, by a sputtering method. Examples of the high-melting-point metal film material include a cobalt film. The high-melting-point metal film can be formed so as to have a thickness of, for example, in the range of 5 nm to 15 nm. The high-melting-point metal film is then heat-treated so that Co atoms in the high-melting-point metal film react with Si atoms in the substrate 101 to form a metal silicide film 119 made of cobalt silicide. In addition, Co atoms in the high-melting-point metal film react with Si atoms in the gate electrode 110 to form a metal silicide film 120 made of cobalt silicide. Then, the unreacted high-melting-point metal film is removed by etching. More specifically, the high-melting-point metal film can be removed by etching, for example, by a batch cleaning apparatus using a mixed solution of sulfuric acid and hydrogen peroxide as a processing liquid at a temperature ranging from 100° C. to 150° C. On the other hand, the pixel region 1000 has a laminated film formed of the silicon oxide film 115 and the silicon nitride film 116, and thus has no metal silicide film formed therein.

In a process illustrated in FIG. 7A, an interlayer insulating film 121 (second insulating film) made of a silicon oxide film is formed. More specifically, the interlayer insulating film 121 is formed, for example, by a high density plasma chemical vapor deposition (HDPCVD) apparatus using a mixed gas of Ar, $O_2$, and $SiH_4$ as a process gas at a temperature ranging from 300° C. to 800°. The interlayer insulating film 121 has a thickness, for example, in the range of 300 nm to 900 nm. This process is a film formation process using plasma after the gate insulating film 108 is formed. However, as described above, in the process illustrated in FIG. 6B, the polysilicon film 109 is exposed to the back surface and the side surface of the substrate 101, which can suppress dielectric breakdown of the gate insulating film 108.

In a process illustrated in FIG. 7B, a photoresist film is formed on the interlayer insulating film 121 as needed and uses the photoresist film as a mask to perform anisotropic etching on the interlayer insulating film 121 to form a contact hole 122. At this time, the portion in contact with a bottom portion of the contact hole 122 in the pixel region 1000 desirably have an impurity concentration allowing electrical connection by metal wiring, and thus impurity ion implantation may be performed through an opening portion of the contact hole 122. Then, the contact hole 122 is filled with a conductive material to form an electrode. Subsequently, a metal wiring, a color filter, a micro lens, and the like are formed. Note that the final metal wiring formation process may include a hydrogen annealing process for promoting hydrogen supply to metal-oxide semiconductor (MOS) transistors.

Figure 8:
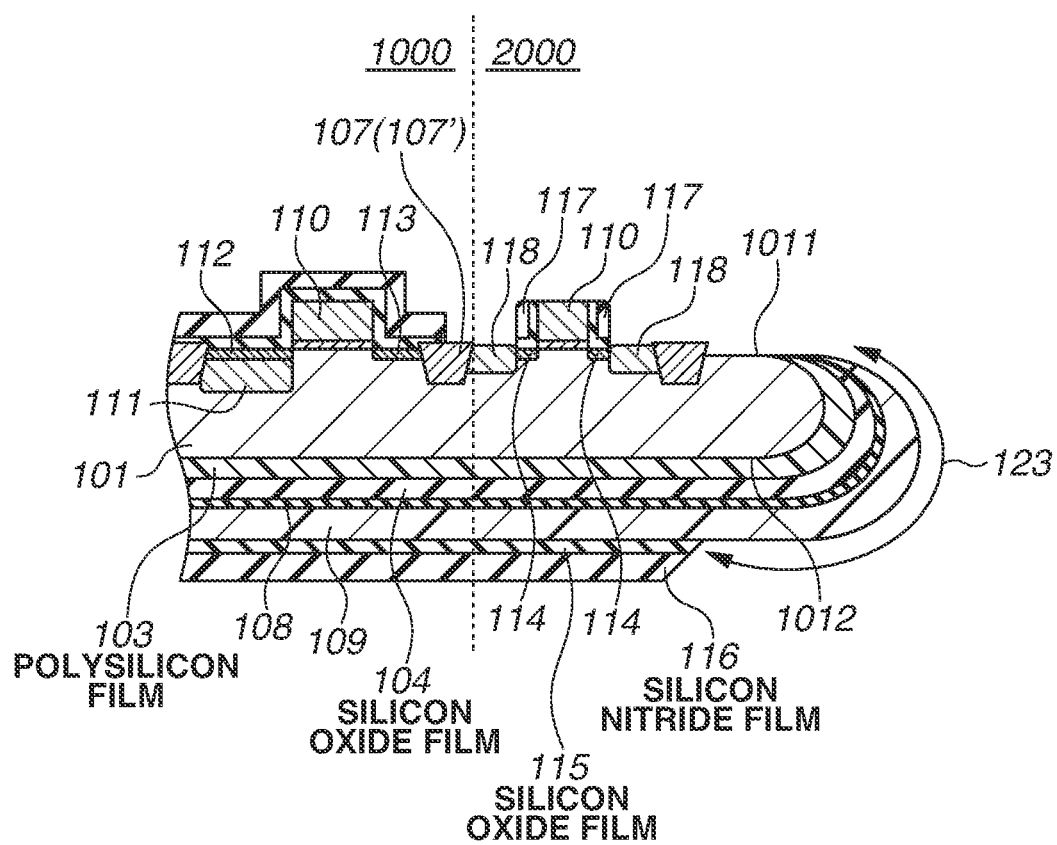
FIG. 8 is a process cross-sectional view illustrating an imaging device manufacturing method according to a second exemplary embodiment.

A second exemplary embodiment is similar to the first exemplary embodiment, except that the process illustrated in FIG. 6B is replaced with a process illustrated in FIG. 8.

The process illustrated in FIG. 8 is performed after the process illustrated in FIG. 6A. In the process of exposing the polysilicon film 109 formed on the peripheral edge portion 123 of the substrate 101, a part of the laminated film including the silicon nitride film 116 and the silicon oxide film 115 remains on the back surface side of the substrate 101. In other words, in this process, only a part of the laminated film formed on the side surface of the substrate and the laminated film formed on the back surface side of the substrate is removed. More specifically, the laminated film is removed, for example, by a single wafer cleaning apparatus using a nozzle allowing only the peripheral edge portion 123 of the substrate 101 to be processed at room temperature with a concentrated HF stock solution.

According to the process illustrated in FIG. 8, a substrate is obtained with which the polysilicon film 109 is exposed in the peripheral edge portion 123 of the substrate 101 in the same manner as in the first embodiment. This process allows electric charge to be released to a processing stage of the apparatus when the interlayer insulating film is subsequently formed by a plasma CVD method, which can provide an imaging device manufacturing method contributing to improved reliability and yield.

Figure 9A:
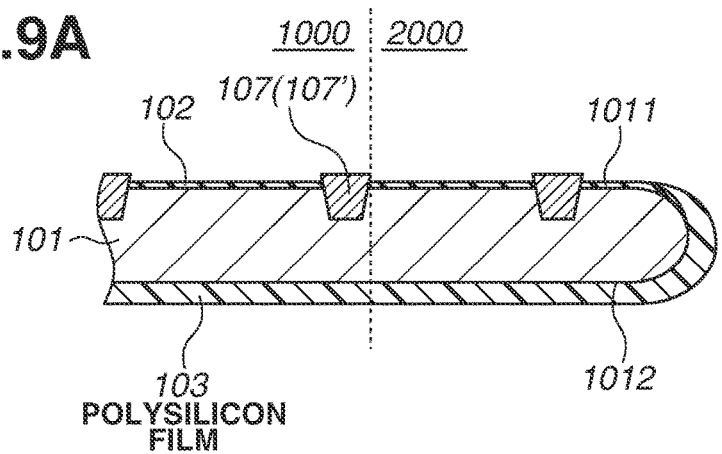
FIGS. 9A, 9B, and 9C are process cross-sectional views illustrating an imaging device manufacturing method according to a third exemplary embodiment.

A third exemplary embodiment is characterized by performing a process illustrated in FIG. 9A instead of the process illustrated in FIG. 4B in the first exemplary embodiment. More specifically, in the first exemplary embodiment as illustrated in FIG. 4B, the silicon oxide film 104 remains on the back surface and the side surface of the substrate 101. However, in the third exemplary embodiment as illustrated in FIG. 9A, the silicon oxide film 104 is removed from the back surface and the side surface of the substrate 101. With this process, the polysilicon film 103 on the back surface and the side surface of the substrate 101 is removed. When a polysilicon film 109 is formed in a subsequent process, no silicon oxide film 104 exists unlike the first exemplary embodiment, and thus the polysilicon film 109 is formed immediately on the polysilicon film 103, resulting in a layered structure. No silicon oxide film is provided between the two layered polysilicon films, which can more easily release the electric charge to the stage side when the interlayer insulating film is formed by a plasma CVD method. In addition, this layered structure improves the gettering effect of removing metal impurities mixed therein in the imaging device manufacturing process.

The silicon oxide film 104 on the back surface side and the side surface of the substrate 101 can be removed, for example, using a single wafer cleaning apparatus with a diluted HF aqueous solution having a concentration of about 100:1 at room temperature.

Figure 9B:
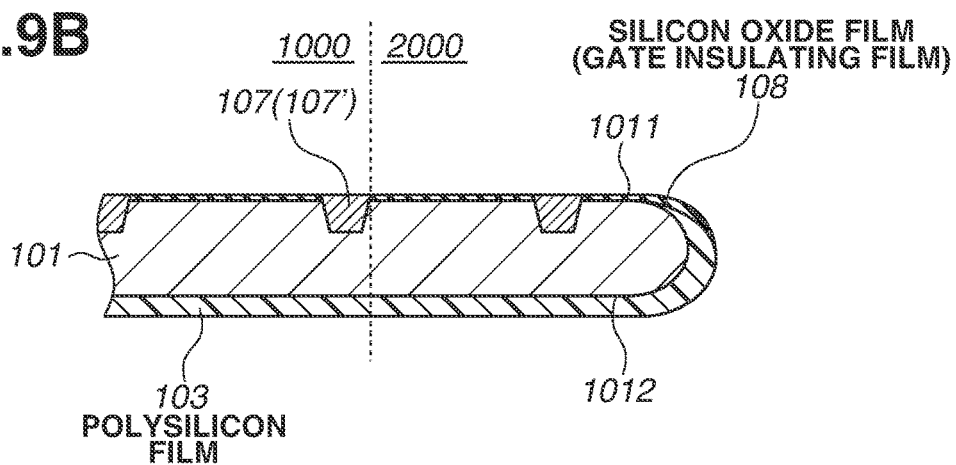

In a process illustrated in FIG. 9B, a gate insulating film 108 is formed so as to cover the front surface 1011, the back surface 1012, and the side surface of the substrate 101. More specifically, the gate insulating film 108 is formed, for example, using an oxidation furnace at a temperature ranging from 800° C. to 1000° C. in an oxidation atmosphere. The gate insulating film 108 has a thickness, for example, in the range of 2 nm to 15 nm. Then, a portion of the gate insulating film 108 on the back surface side and the side surface is removed from the entire gate insulating film 108 formed to cover the back surface and the side surface of the substrate 101. Then, the polysilicon film 103 on the back surface side and the side surface of the substrate 101 is exposed. The gate insulating film 108 can be removed, for example, using a single wafer cleaning apparatus with a diluted HF aqueous solution having a concentration of about 100:1 at room temperature.

Figure 9C:
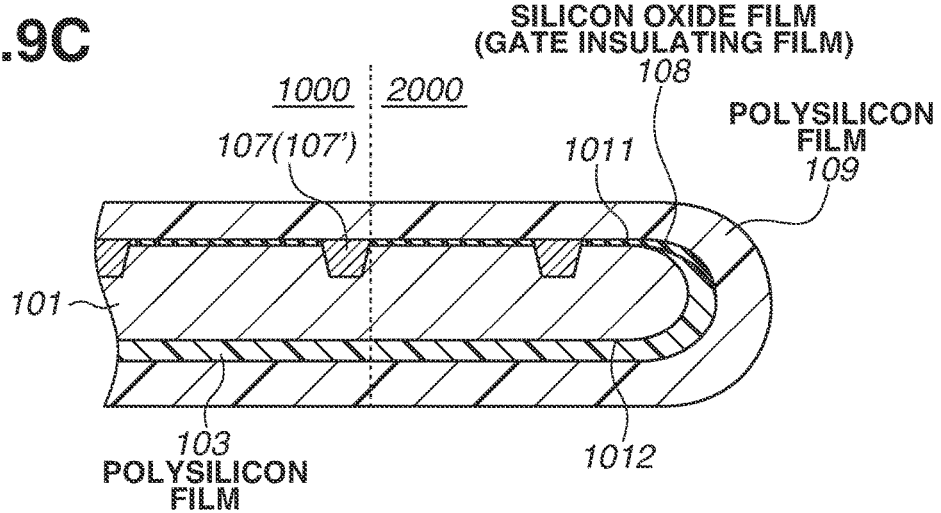

Then, in a process illustrated in FIG. 9C, a polysilicon film 109 is formed to cover the front surface, the back surface, and the side surface of the substrate 101. More specifically, the polysilicon film 109 is formed, for example, using a low-pressure thermal CVD apparatus in a $SiH_4$ gas atmosphere at a temperature ranging from 530° C. to 650°

C. at a pressure ranging from 10 Pa to 150 Pa. The polysilicon film 109 has a thickness, for example, in the range of 100 nm to 300 nm.

Then, the process illustrated in FIG. 5A and the subsequent processes described in the first exemplary embodiment are performed.

According to the present exemplary embodiment, a substrate having the polysilicon film 109 exposed on the peripheral edge portion 123 of the substrate 101 like the first exemplary embodiment, can be obtained. Thus, when an interlayer insulating film is subsequently formed by a plasma CVD method, electric charge can be released to a processing stage of the apparatus, which can provide an imaging device manufacturing method contributing to improved reliability and yield. In addition, the layered structure made of polysilicon can further improve not only reliability and yield but also can improve the gettering effect.

While the present disclosure has been described with reference to exemplary embodiments, it is to be understood that the invention is not limited to the disclosed exemplary embodiments. The scope of the following claims is to be accorded the broadest interpretation so as to encompass all such modifications and equivalent structures and functions.

This application claims the benefit of Japanese Patent Application No. 2015-249094, filed Dec. 21, 2015, which is hereby incorporated by reference herein in its entirety.

What is claimed is:

1. An imaging device manufacturing method, comprising:
   preparing a substrate including a first main surface on which a plurality of transistors is to be formed and a second main surface at an opposite side of the first main surface;
   forming a polysilicon film on the first main surface, on the second main surface, and on a side surface of the substrate;
   forming a first insulating film on the polysilicon film formed on the first main surface, on the second main surface, and on the side surface of the substrate;
   exposing the polysilicon film formed on the second main surface and on the side surface of the substrate by removing a portion of the first insulating film formed on the second main surface and a portion of the first insulating film formed on the side surface of the substrate; and
   forming a second insulating film on the first main surface by a plasma chemical vapor deposition (CVD) method after the exposing of the polysilicon film.

2. The imaging device manufacturing method according to claim 1, wherein, in the exposing of the polysilicon film, the first insulating film is exposed so that a part of the first insulating film remains on the second main surface.

3. The imaging device manufacturing method according to claim 1, wherein the first insulating film is a laminated film including a silicon oxide film and a silicon nitride film and the second insulating film is a silicon oxide film.

4. The imaging device manufacturing method according to claim 1, further comprising before the forming of the polysilicon film:
   forming another polysilicon film on the first main surface, on the second main surface, and on the side surface of the substrate;
   forming another silicon oxide film on the another polysilicon film formed on the first main surface, on the second main surface, and on the side surface of the substrate; and
   removing the another silicon oxide film formed on the another polysilicon film on the second main surface.

5. The imaging device manufacturing method according to claim 1, wherein a plurality of transistors provided in a pixel region and a plurality of transistors provided in a peripheral circuit region located outside the pixel region are formed before the second insulating film is formed.

6. The imaging device manufacturing method according to claim 5, further comprising patterning the polysilicon film provided on the first main surface after the polysilicon film is formed; and
   wherein the patterned polysilicon film forms gate electrodes of a plurality of transistors provided in the pixel region and gate electrodes of a plurality of transistors provided in the peripheral circuit region.

7. The imaging device manufacturing method according to claim 5, further comprising etching the first insulating film provided on the first main surface after the first insulating film is formed, and
   wherein, in the etching of the first insulating film, the first insulating film forms side walls of the gate electrodes of the plurality of transistors provided in the peripheral circuit region.

8. The imaging device manufacturing method according to claim 7, wherein, in the etching of the first insulating film, the first insulating film is provided so as to cover the gate electrodes, source regions, and drain regions of the plurality of transistors provided in the pixel region.

* * * * *